(12) United States Patent
Chen et al.

(10) Patent No.: US 8,455,274 B2
(45) Date of Patent: Jun. 4, 2013

(54) METHOD FOR MANUFACTURING LIGHT EMITTING DIODE

(75) Inventors: Pin-Chuan Chen, Hsinchu (TW); Hsin-Chiang Lin, Hsinchu (TW); Wen-Liang Tseng, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 62 days.

(21) Appl. No.: 13/286,090

(22) Filed: Oct. 31, 2011

(65) Prior Publication Data

US 2012/0244651 A1 Sep. 27, 2012

(30) Foreign Application Priority Data

Mar. 21, 2011 (CN) .......................... 2011 1 0067219

(51) Int. Cl.
*H01L 33/48* (2010.01)

(52) U.S. Cl.
USPC .................. 438/26; 438/27; 438/28; 438/33; 438/113; 438/116

(58) Field of Classification Search
None
See application file for complete search history.

(56) References Cited

U.S. PATENT DOCUMENTS

| | | | | |
|---|---|---|---|---|
| 4,797,715 A * | 1/1989 | Thillays et al. | ................. | 257/81 |
| 6,214,525 B1 * | 4/2001 | Boyko et al. | ................. | 430/313 |
| 6,531,328 B1 * | 3/2003 | Chen | ................. | 438/26 |
| 6,730,533 B2 * | 5/2004 | Durocher et al. | ................. | 438/26 |
| 7,411,225 B2 * | 8/2008 | Kim et al. | ................. | 257/100 |
| 7,982,237 B2 * | 7/2011 | Kim et al. | ................. | 257/99 |
| 7,994,628 B2 * | 8/2011 | Tseng et al. | ................. | 257/690 |
| 8,043,876 B2 * | 10/2011 | Lee et al. | ................. | 438/28 |
| 8,048,694 B2 * | 11/2011 | Wen et al. | ................. | 438/26 |
| 8,134,160 B2 * | 3/2012 | Matsuda | ................. | 257/79 |
| 8,222,059 B2 * | 7/2012 | Ashida | ................. | 438/28 |
| 8,314,438 B2 * | 11/2012 | Lin et al. | ................. | 257/98 |
| 2002/0163006 A1 * | 11/2002 | Yoganandan et al. | ................. | 257/81 |
| 2003/0153108 A1 * | 8/2003 | Durocher et al. | ................. | 438/26 |
| 2006/0018120 A1 * | 1/2006 | Linehan et al. | ................. | 362/247 |
| 2006/0138436 A1 * | 6/2006 | Chen et al. | ................. | 257/98 |
| 2006/0208271 A1 * | 9/2006 | Kim et al. | ................. | 257/100 |
| 2007/0090510 A1 * | 4/2007 | Tseng et al. | ................. | 257/690 |
| 2008/0006837 A1 * | 1/2008 | Park et al. | ................. | 257/98 |
| 2010/0148210 A1 * | 6/2010 | Huang et al. | ................. | 257/99 |
| 2010/0295090 A1 * | 11/2010 | Craford et al. | ................. | 257/99 |
| 2011/0114989 A1 * | 5/2011 | Suehiro et al. | ................. | 257/99 |
| 2011/0284887 A1 * | 11/2011 | Wu et al. | ................. | 257/91 |
| 2012/0273808 A1 * | 11/2012 | Kim et al. | ................. | 257/88 |

* cited by examiner

*Primary Examiner* — David E Graybill
(74) *Attorney, Agent, or Firm* — Altis Law Group, Inc.

(57) ABSTRACT

A method for manufacturing light emitting diodes includes steps: providing a substrate having an upper conductive layer and a lower conductive layer formed on a top face and bottom face thereof; dividing each of the upper conductive layer and the lower conductive layer into first areas and second areas; defining cavities in the substrate through the first areas of the upper conductive layer to expose the lower conductive layer; forming conductive posts within the substrate; forming an overlaying layer to connect the first areas of the upper and lower conductive layers; mounting chips on the overlaying layer within the cavities and electrically connecting each chip with an adjacent first area and post; forming an encapsulant on the substrate to cover the chips; and cutting the substrate into individual packages.

17 Claims, 12 Drawing Sheets

METHOD FOR MANUFACTURING LIGHT EMITTING DIODE

BACKGROUND

1. Technical Field

The present disclosure relates to a method for manufacturing light emitting diodes, and more particularly, to a method for manufacturing light emitting diodes having high heat dissipation performance.

2. Description of Related Art

As a new type of light source, LEDs are widely used in various applications. A typical LED includes a base, a pair of leads inserted into the base, a light emitting chip fixed on the base and electrically connected to the leads via wires, and an encapsulant attached on the base and sealing the light emitting chip. The base is often made of epoxy or silicon for insulation of the two leads of the LED. This LED is often made by molding an epoxy or silicon block on a patterned metal plate, and then fixing a plurality of light emitting chips on the block, bonding wires from the light emitting chips to the metal plate, molding a transparent material on the base to seal the light emitting chips, and cutting the block and metal plate to individual packages.

However, the LED manufactured by this method has a limited heat dissipation capability, since the epoxy or silicon base has a low heat conductivity. The operation of the LED is affected by accumulated heat within the LED.

What is needed, therefore, is a method for manufacturing light emitting diodes which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

A method for manufacturing light emitting diodes in accordance with an embodiment of the present disclosure is disclosed. The method mainly includes multiple steps as described below.

Figure 1:
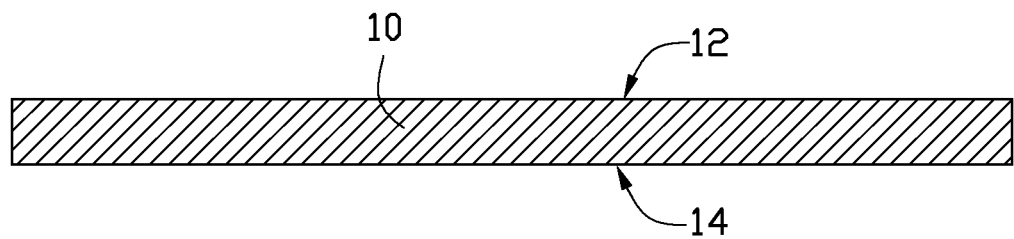
FIG. 1 shows a first process of manufacturing light emitting diodes in accordance with an embodiment of the present disclosure.

As shown in FIG. 1, a substrate 10 is provided. The substrate 10 may be made of epoxy, silicon, ceramic or other electrically insulating materials. The substrate 10 has a flat top face 12 and a flat bottom face 14 opposite to the top face 12.

Figure 2:
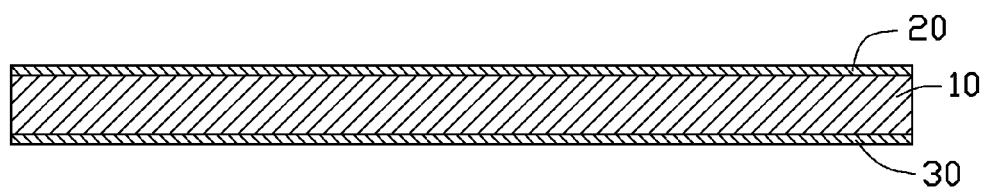
FIG. 2 shows a second process of manufacturing light emitting diodes in accordance with the embodiment of the present disclosure.

As shown in FIG. 2, an upper conductive layer 20 and a lower conductive layer 30 are formed on the top face 12 and the bottom face 14 of the base 10, respectively. The upper conductive layer 20 and the lower conductive layer 30 are parallel to each other and both are made of metal such as copper, aluminum or silver. The upper conductive layer 20 and the lower conductive layer 30 may be formed by deposition, sputtering, adhering or other suitable methods.

Figure 3:
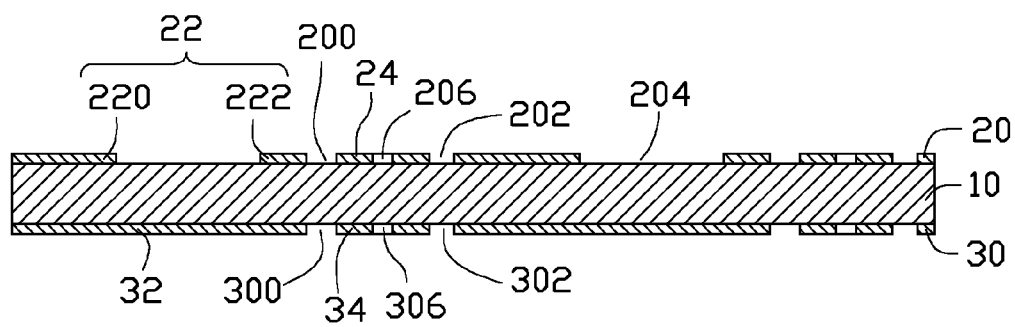
FIG. 3 shows a third process of manufacturing light emitting diodes in accordance with the embodiment of the present disclosure.
Figure 4:
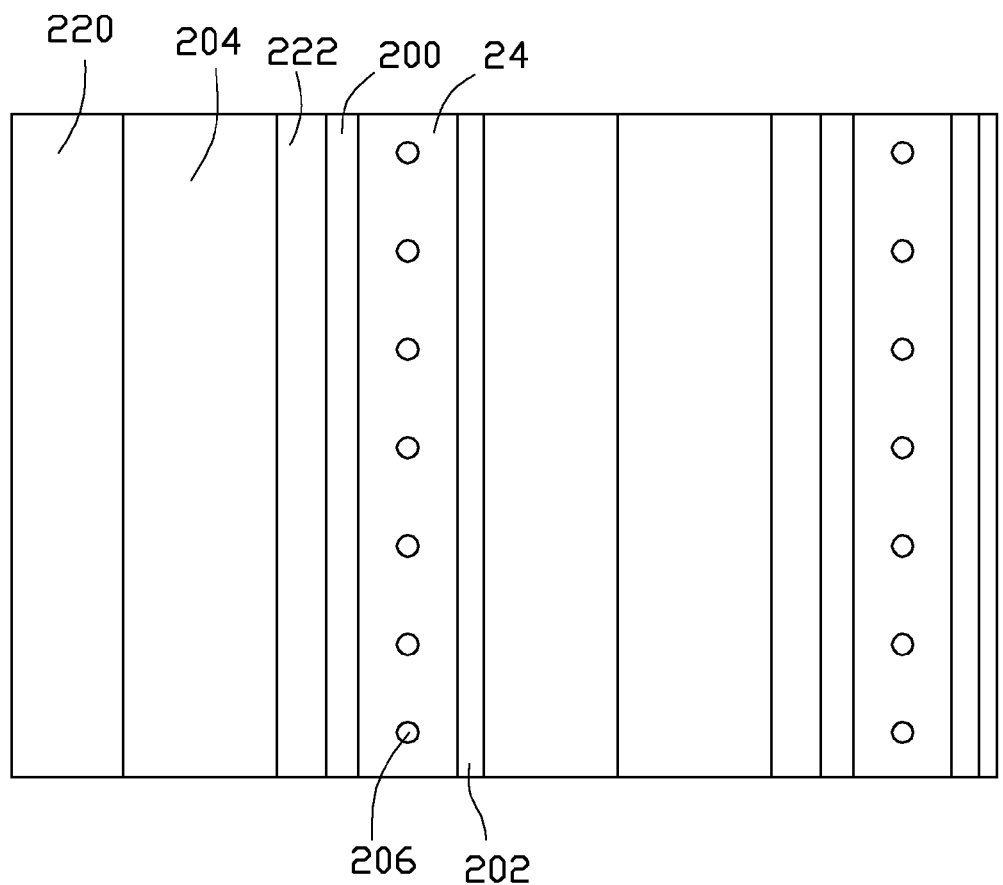
FIG. 4 is top view of a semi-finished product obtained from the third process of manufacturing light emitting diodes of FIG. 3.
Figure 5:
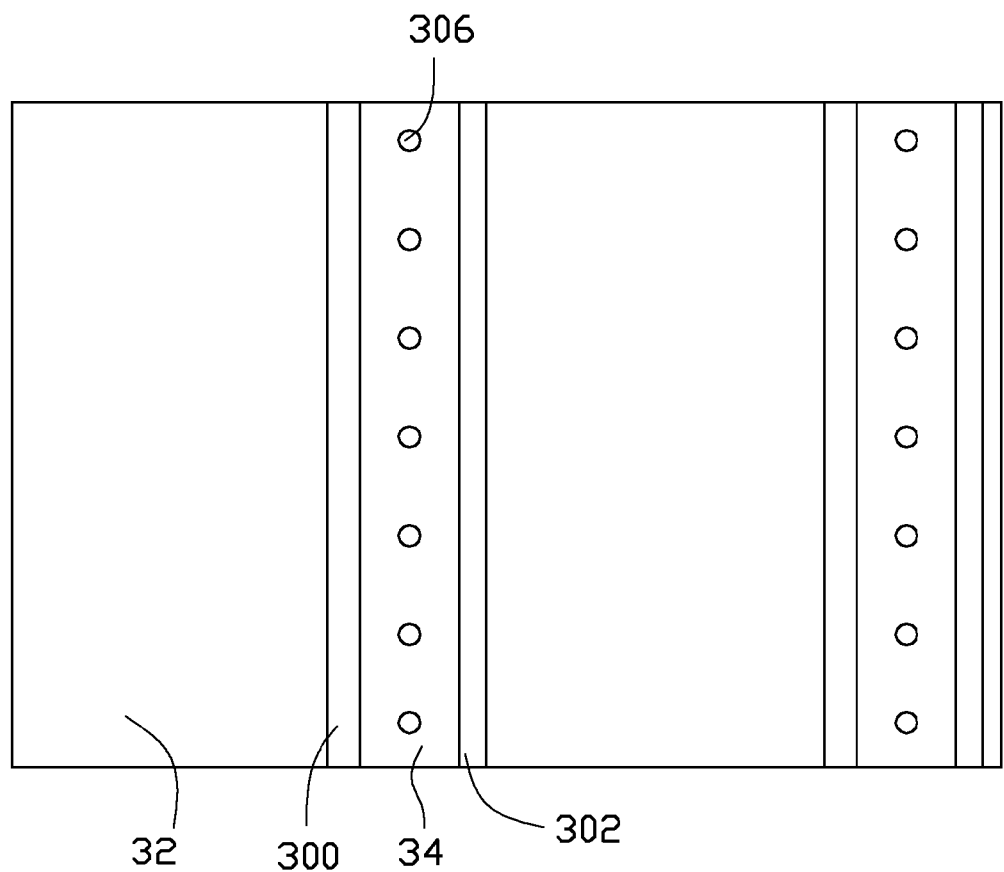
FIG. 5 is a bottom view of the semi-finished product obtained from the third process of manufacturing light emitting diodes of FIG. 3.

As shown in FIGS. 3-5, then a plurality of grooves 200, 202, 204, 300, 302 are defined in the upper conductive layer 20 and the lower conductive layer 30 to expose parts of the top face 12 and bottom face 14 of the substrate 10. The grooves 200, 202, 204 defined in the upper conductive layer 20 can be divided into two groups, wherein each group includes a first upper groove 200, a second upper groove 202 and a third upper groove 204. The first, second and third upper grooves 200, 202, 204 are all extended through the upper conductive layer 20 from a front side of the substrate 10 to an opposite rear side of the substrate 10. The first upper groove 200 of each group has a width the same as that of the second upper groove 202, and smaller than that of the third upper groove 204. The upper conductive layer 20 is divided by the first and second upper grooves 200, 202 into two first upper areas 22 and two second upper areas 24 alternating with the first upper areas 22. Each first upper area 22 is further divided by a corresponding third upper groove 204 into a first strip 220 and a second strip 222. The first strip 220 has a width larger than that of the second strip 222, and similar to that of the second upper area 24. Each second upper area 24 is located between an adjacent first strip 220 and second strip 222. A plurality of upper holes 206 are defined in each of the second upper areas 24. The upper holes 206 in each second upper area 24 are arranged in a straight line. Each upper hole 206 is terminated at the top face 12 of the substrate 10.

The grooves 300, 302 defined in the lower conductive layer 30 include first lower grooves 300 and second lower grooves 302 alternating with the first lower grooves 300. The lower conductive layer 30 is divided by the first lower grooves 300 and second lower grooves 302 into two discrete first lower areas 32 and second lower areas 34 alternating with the first lower areas 32. A plurality of lower holes 306 are defined in each of the second lower areas 34 and arranged along a straight line. The first lower grooves 300, the second lower grooves 302, the first lower areas 32, the second lower areas 34 and the lower holes 306 are located corresponding to the first upper grooves 200, the second upper grooves 202, the first upper areas 22, the second upper areas 24 and the upper holes 206, respectively.

Figure 6:
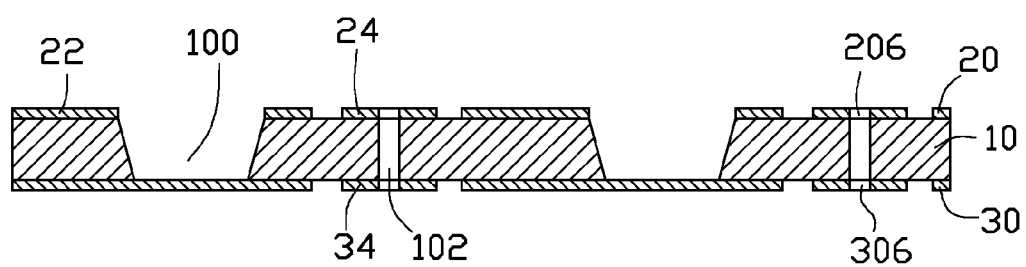
FIG. 6 shows a fourth process of manufacturing light emitting diodes in accordance with the embodiment of the present disclosure.

Also referring to FIG. 6, the substrate 10 is etched to form a plurality of cavities 100 and through holes 102. Each cavity 100 is defined between adjacent first strip 220 and second strip 222. Each cavity 100 is terminated at a top face of a corresponding first lower area 32 of the lower conductive layer 30 so that a top face of the first lower area 32 is exposed within the cavity 100. Each cavity 100 has an inner diameter gradually decreasing from the top face 12 of the substrate 10 towards the bottom face 14 of the substrate 10. Each through hole 102 extends from the top face 12 of the substrate 10 to the bottom face 14 of the substrate 10. Each through hole 102 is aligned and communicates with a corresponding upper hole 206 and lower hole 306. The cavities 100 and the through holes 102 can also be formed by drilling, laser or other suitable methods.

Figure 7:
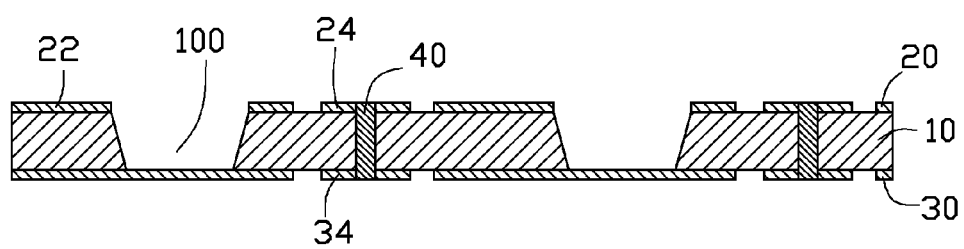
FIG. 7 shows a fifth process of manufacturing light emitting chips in accordance with the embodiment of the present disclosure.

A conductive material is filled into the through holes 102 and the upper holes 206 and the lower holes 306 to form a plurality of conductive posts 40 within the substrate 10 as shown in FIG. 7. Each conductive post 40 mechanically and electrically connects a corresponding second upper area 24 and a second lower area 34 located just below the corresponding second upper area 24. The conductive post 40 has a top face flush with that of the second upper area 24, and a bottom face flush with that of the second lower area 34. The conductive posts 40 may be formed by electro-plating metal into the through holes 102 or injecting conductive adhesive into the through holes 102.

Figure 8:
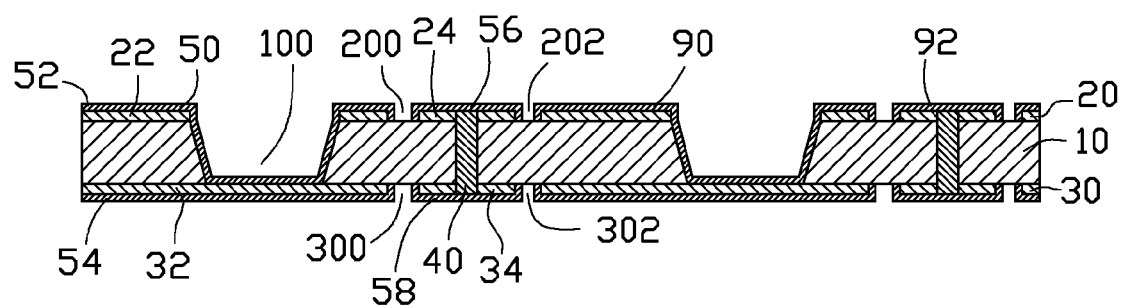
FIG. 8 shows a sixth process of manufacturing light emitting diodes in accordance with the embodiment of the present disclosure.

An overlaying layer 50 is further formed to cover the upper conductive layer 20 and the lower conductive layer 30 as shown in FIG. 8. The overlaying layer 50 has upper parts 52 each covering a top face and a lateral face of the first strip 220, an inner circumferential face and a bottom face of the cavity 100 and a top face and a lateral face of the second strip 222 The bottom face of the cavity 100 is coincidental with the exposed top face of the first lower area 32. The overlaying layer 50 further has lower parts 54 each covering two lateral faces and a bottom face of the first lower area 32. The upper part 52 and the lower part 54 of the overlaying layer 50, the first upper area 22 and the first lower area 32 cooperatively form a first lead. The overlaying layer 50 also has the other upper parts 56 each covering two lateral faces and a top face of the second upper area 24 and a top face of the conductive post 40, and the other lower parts 58 each covering two lateral faces and a bottom face of the second lower area 34 and a bottom face of the conductive post 40. The other upper part 56, the other lower part 58, the conductive post 40, the second upper area 24 and the second lower area 34 cooperatively form a second lead. Each second lead is spaced from two adjacent first leads via the first upper groove 200, the second upper groove 202, the first lower groove 300 and the second lower groove 302. The overlaying layer 50 may be formed by electro-plating or chemical-plating.

Figure 9:
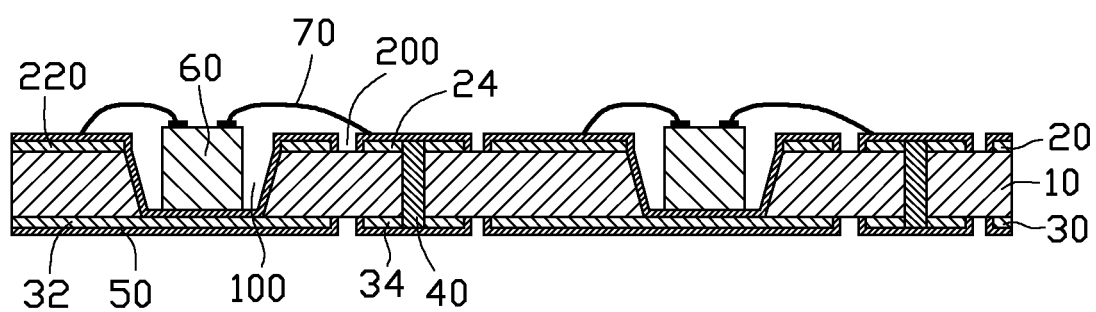
FIG. 9 shows a seventh process of manufacturing light emitting diodes in accordance with the embodiment of the present disclosure.

Also referring to FIG. 9, a plurality of light emitting chips 60 are mounted within the cavities 100, respectively. Each light emitting chip 60 is fixed on a top face of a portion of the overlaying layer 50 within the cavity 100. A pair of wires 70 electrically connect the light emitting chip 60 with the first lead and the second lead, wherein one wire 70 is bonded to a portion of the overlaying layer 50 corresponding to the first strip 220, and the other wire 70 is bonded to a portion of the overlaying layer 50 corresponding to the second upper area 24. The light emitting chip 60 may be made of GaN, InGaN, AlInGaN or other suitable materials.

Figure 10:
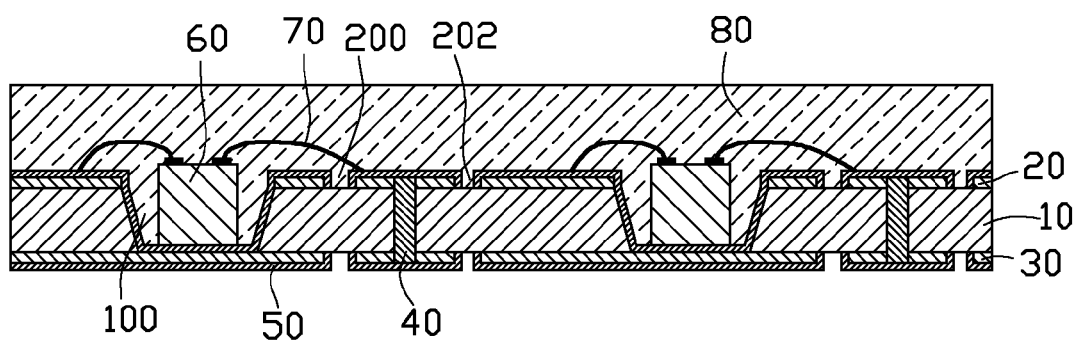
FIG. 10 shows an eighth process of manufacturing light emitting diodes in accordance with the embodiment of the present disclosure.

An encapsulant 80 is molded on the substrate 10 to seal the light emitting chips 60 as shown in FIG. 10. The encapsulant 80 joins the overlaying layer 50 and fills the first upper grooves 200 and the second upper grooves 202. The encapsulant 50 may be made of epoxy, silicon or other transparent materials.

Figure 11:
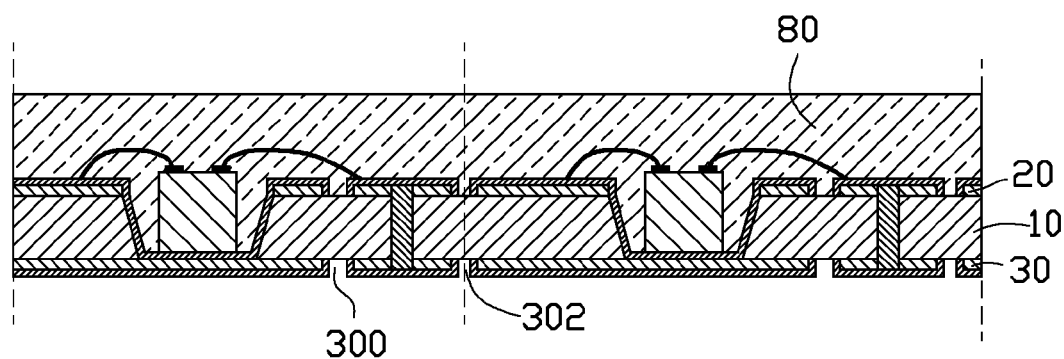
FIG. 11 shows a ninth process of manufacturing light emitting diodes in accordance with the embodiment of the present disclosure.
Figure 12:
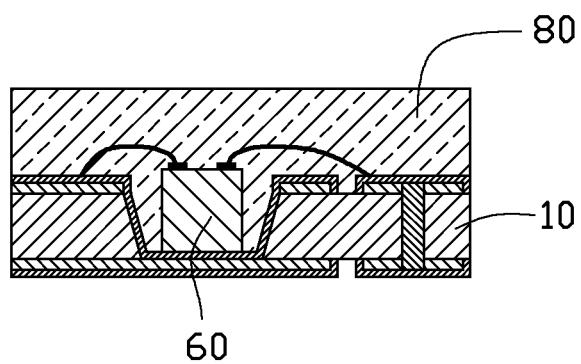
FIG. 12 shows a light emitting diode which has been manufactured after the processes of FIGS. 1-11.

The substrate 10 together with the encapsulant 80 are then cut into a plurality of individual LED packages through the second upper grooves 202 and the second lower grooves 302 as shown in FIG. 11. FIG. 12 shows one of the LED packages having been manufactured. The LED includes one first lead, one second lead and one light emitting chip 60 electrically connected to the first lead and the second lead. The first lead and the second lead can be electrically coupled with a power source to activate the light emitting chip 60 to lighten.

Since the light emitting chip 60 is fixed on the overlaying layer 50 which is directly connected to the lower conductive layer 30, the heat conducting pathway from the light emitting chip 60 to the outside of the LED is shorten and the heat can be rapidly conducted from the light emitting chip 60 to the outside of the LED through the overlaying layer 50 and the lower conductive layer 30.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A method for manufacturing light emitting diodes, comprising:
   providing a substrate;
   forming an upper conductive layer and a lower conductive layer on a top face and a bottom face of the substrate, respectively;
   forming a plurality of upper grooves and lower grooves through the upper conductive layer and the lower conductive layer in a manner that each of the upper conductive layer and the lower conductive layer is divided into a plurality of first areas and second areas alternating with the first areas;
   forming a plurality of cavities in the substrate through the first areas of the upper conductive layer to expose a top face of the lower conductive layer;
   forming a plurality of conductive posts within the substrate to electrically connect the second areas of the upper conductive layer with the second areas of the lower conductive layer, respectively;
   providing an overlaying layer, the overlaying layer comprising first parts covering and connecting the first areas of the upper conductive layer and the exposed top face of the lower conductive layer, respectively;
   fixing a plurality of light emitting chips on the first parts of the overlaying layer within the cavities and electrically connecting each of the light emitting chips with an adjacent first part of the overlaying layer and an adjacent conductive post;
   sealing the light emitting chips with an encapsulant; and
   cutting the substrate and the encapsulant to form a plurality of individual packages each comprising a corresponding light emitting chip and a corresponding post.

2. The method of claim 1, wherein the upper grooves comprise first upper grooves and second upper grooves, and the first upper grooves, the second grooves and the cavities are alternately arranged.

3. The method of claim 2, wherein one of the first areas of the upper conductive layer is separated from two adjacent second areas via a corresponding first upper groove and a corresponding second upper groove.

4. The method of claim 2, wherein the lower grooves comprise first lower grooves and second lower grooves, and one of the second areas of the lower conductive layer is separated from two adjacent first areas of the lower conductive layer via a corresponding first lower groove and a corresponding second lower groove.

5. The method of claim 4, wherein the substrate is cut through second upper grooves and the second lower grooves.

6. The method of claim 1, wherein the conductive posts are formed by defining through holes in the substrate and then filling a conductive material into the through holes.

7. The method of claim 1, wherein the first part of the overlaying layer also covers an inner circumferential face of the cavity to connect a corresponding first area of the upper conductive layer with a corresponding first area of the lower conductive layer.

8. The method of claim 1, wherein the conductive posts have top faces flush with that of the second areas of the upper conductive layer.

9. The method of claim 2, wherein the overlaying layer further comprises second parts covering the top faces of the conductive posts and the second areas of the upper conductive layer connected to the conductive posts, respectively.

10. The method of claim 9, wherein the first parts of the overlaying layer are separated from the second parts of the overlaying layer via the first upper grooves and the second upper grooves.

11. The method of claim 9, wherein the overlaying layer further comprises third parts covering the first areas of the lower conductive layer and fourth parts covering bottom faces of the conductive posts and the second areas of the lower conductive layer connected to the conductive posts.

12. The method of claim 11, wherein the third parts of the overlaying layer are separated from the fourth parts of the overlaying layer via the first lower grooves and the second lower grooves, respectively.

13. The method of claim 9, wherein the light emitting chips each are electrically connected to an adjacent first part and an adjacent second part of the overlaying layer via two wires.

14. The method of claim 13, wherein one of the two wires is bonded to the adjacent first part of the overlaying layer corresponding to one of the first areas of the upper conductive layer, and the other one of the two wires is bonded to the adjacent second part of the overlaying layer corresponding to one of the second areas of the upper conductive layer.

15. The method of claim 1, wherein the encapsulant is formed by molding a transparent material on the overlaying layer.

16. The method of claim 2, wherein the encapsulant fills the first upper grooves and the second upper grooves.

17. The method of claim 1, wherein each of the first areas of the upper conductive layer has a width larger that that of each of the second areas of the upper conductive layer.

* * * * *